(12) United States Patent
Hsiao et al.

(10) Patent No.: US 7,867,005 B2
(45) Date of Patent: Jan. 11, 2011

(54) IC SOCKET HAVING IMPROVED LATCH DEVICES

(75) Inventors: Shih-Wei Hsiao, Tu-Cheng (TW);
Wen-Yi Hsieh, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/481,600

(22) Filed: Jun. 10, 2009

(65) Prior Publication Data

US 2009/0305526 A1   Dec. 10, 2009

(30) Foreign Application Priority Data

Jun. 10, 2008   (TW) .................................. 97210220

(51) Int. Cl.
*H01R 13/62* (2006.01)
(52) U.S. Cl. ........................................ 439/331; 439/73
(58) Field of Classification Search ................. 439/330, 439/331, 73
See application file for complete search history.

(56) References Cited

U.S. PATENT DOCUMENTS 6,848,928 B2 * 2/2005 Ikeya et al. .................. 439/331
6,957,965 B2 10/2005 Huang et al.

* cited by examiner

*Primary Examiner*—Ross N Gushi
(74) *Attorney, Agent, or Firm*—Andrew C. Cheng; Wei Te Chung; Ming Chieh Chang

(57) ABSTRACT

An IC socket (100) for receiving an IC package includes a socket body for carrying the IC package, a plurality of contacts (3) received in the socket body for electrical connection with the IC package, a driving member (5) mounted upon the socket body, and at least one latch device (19) driven by the driving member (5) to shift between a closed position and an opened position. The driving member (5) is able to be operated between an upper position and a lower position. The latch device (19) has a movable pressing member (194) engaging with a spring member (1943) and pressing the IC package toward the socket body. The position of pressing member (194) is adjusted in a vertical direction by abutting against the IC package.

15 Claims, 5 Drawing Sheets

IC SOCKET HAVING IMPROVED LATCH DEVICES

FIELD OF THE INVENTION

The present invention relates to an IC socket, and more particularly to an IC socket having adjustable latch devices adapted to receive various IC packages of different thicknesses therein for testing purpose.

DESCRIPTION OF PRIOR ART

IC sockets are widely used in testing IC packages, to ensure only the IC packages that passing the test, especially in electrical characteristics, can be shipped and used by customers.

U.S. Pat. No. 7,121,858 issued to Chen on Oct. 17, 2006 discloses a typical IC socket for interconnecting an IC package and a test board. The IC socket includes a base mounted on the test board, a number of contacts retained in the base, and a driving member mounted upon the base to drive a pair of latch members to press the IC package firmly within the socket. The driving member has a rectangular shape and is manually or automatically operated from an upper position to a lower position. Correspondingly, the latch member is actuated from a closed position to an opened position. During this process, the latch member rotates upward and rearward to provide a clearance for receiving the IC package. When the latch member is turned form the opened position to the closed position, it then rotates downward and forward to press the IC package so as to secure the IC package onto the base.

However, due to the rigidity and non-deformability of the latch member, the thicknesses of the IC packages must keep constant. In other words, when a loaded IC package is with different thickness other then previous one, the latch member must be changed with another one to maintain a fine latching effect.

Thus, there is a need to provide a new IC socket that overcomes the above-mentioned problems.

SUMMARY OF THE INVENTION

It is therefore the object of the present invention to provide an IC socket having an improved latch device adapted to IC packages of different thicknesses.

In accordance with the present invention, an IC socket for receiving an IC package is provided, which includes a socket body for carrying the IC package, a plurality of contacts received in the socket body for electrical connection with the IC package, a driving member mounted upon the socket body, and at least one latch device driven by the driving member to shift between a closed position and an opened position. The driving member is able to be operated between an upper position and a lower position. The latch device has a movable pressing member engaging with a spring member and pressing the IC package toward the socket body. The position of pressing member is adjusted in a vertical direction by abutting against the IC package.

BRIEF DESCRIPTION OF THE DRAWINGS

Other objects, advantages and novel features of the present invention will become more apparent from the following detailed description when taken in conjunction with the accompanying drawings, in which.

DETAILED DESCRIPTION OF PREFERRED EMBODIMENT

Figure 1:
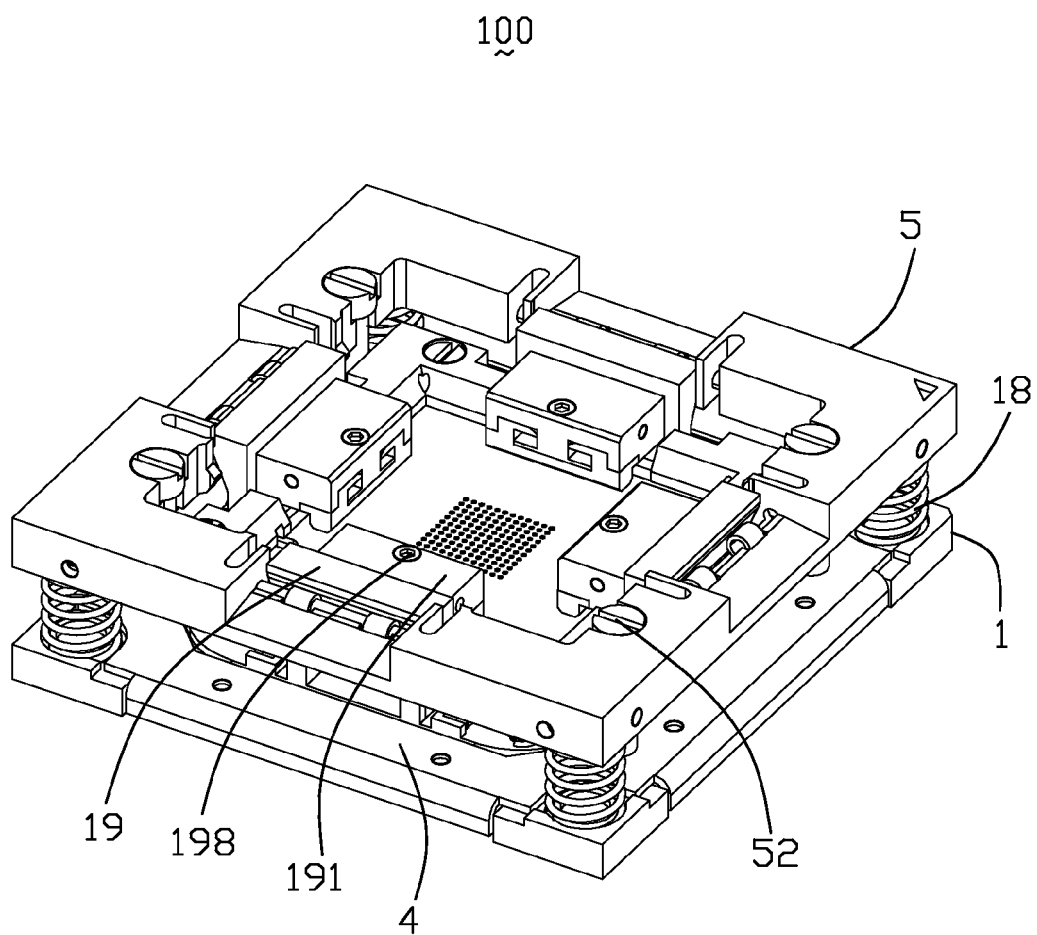
FIG. 1 is an assembled, perspective view of an IC socket in accordance with a preferred embodiment of the present invention.
Figure 2:
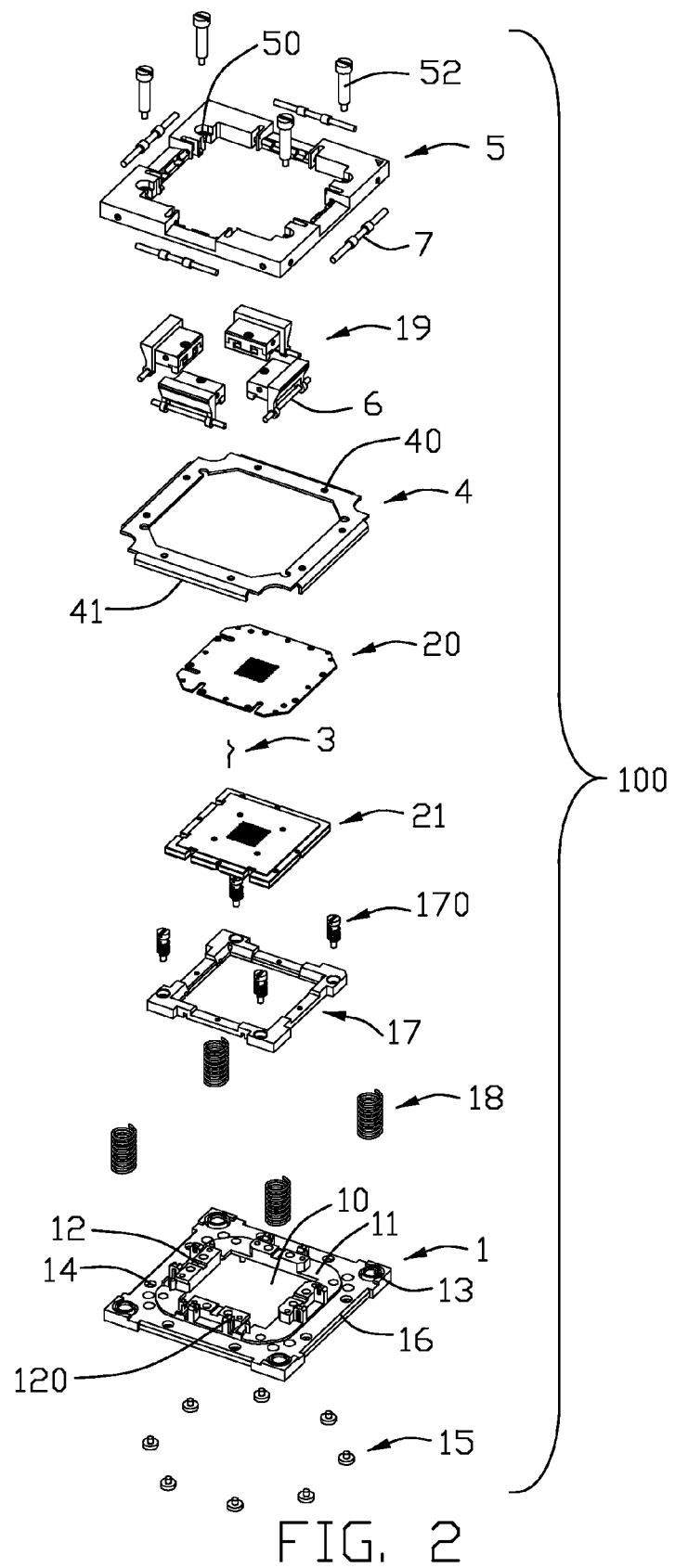
FIG. 2 is an exploded, perspective view of the IC socket shown in FIG. 1.

Referring to FIGS. 1-2, an IC socket 100 made in accordance with a preferred embodiment of the present invention is used for receiving an IC package (not shown) therein. The IC socket 100 includes a socket body (not labeled) for receiving the IC package therein, a plurality of contacts 3 received in the socket body for electrical connection with the IC package, and a driving member 5 mounted upon the socket body and is able to be operated between an upper position and a lower position to drive four latch devices 19.

The socket body includes a base 1, a securing frame 17 seated on the base by four bolts 170, a retaining board 21 received in the securing frame 17 for retaining the contacts 3 which are arranged in a matrix array, and a alignment board 20 for aligning the array of the contacts 3. The ends of the contacts 3 extend beyond the alignment board 20 to make contact with the IC package. In addition, an enforcing element 4 is provided to strengthen the socket body. The base 1 has four side edges 11 with an opening 10 therebetween. Four supporting holes 13 are arranged in the corners of the base 1 for containing four springs 18 which provide elastic force for the driving member 5. The enforcing member 4 includes a top plate (not labeled) covering the side edges 11 of the base 1 and four shielding plates 41 extending downwardly from the periphery of the top plate into corresponding recesses 16 defined from the side edge 11 of the base 1. The top plate is configured with a plurality of fixing holes 40, and correspondingly the base 1 is provided with a plurality of through holes 14 formed in the side edges 11. A plurality of screws 15 are locked into the through holes 14 and the fixing holes 40 so as to secure the enforcing member 4 within the socket body. In addition, four elevated portions 12 extend from side edges 11 and surround the opening 10. Behind each elevated potion 12 is a pair of linking portions 120 for mounting the latch device 19.

Figure 3:
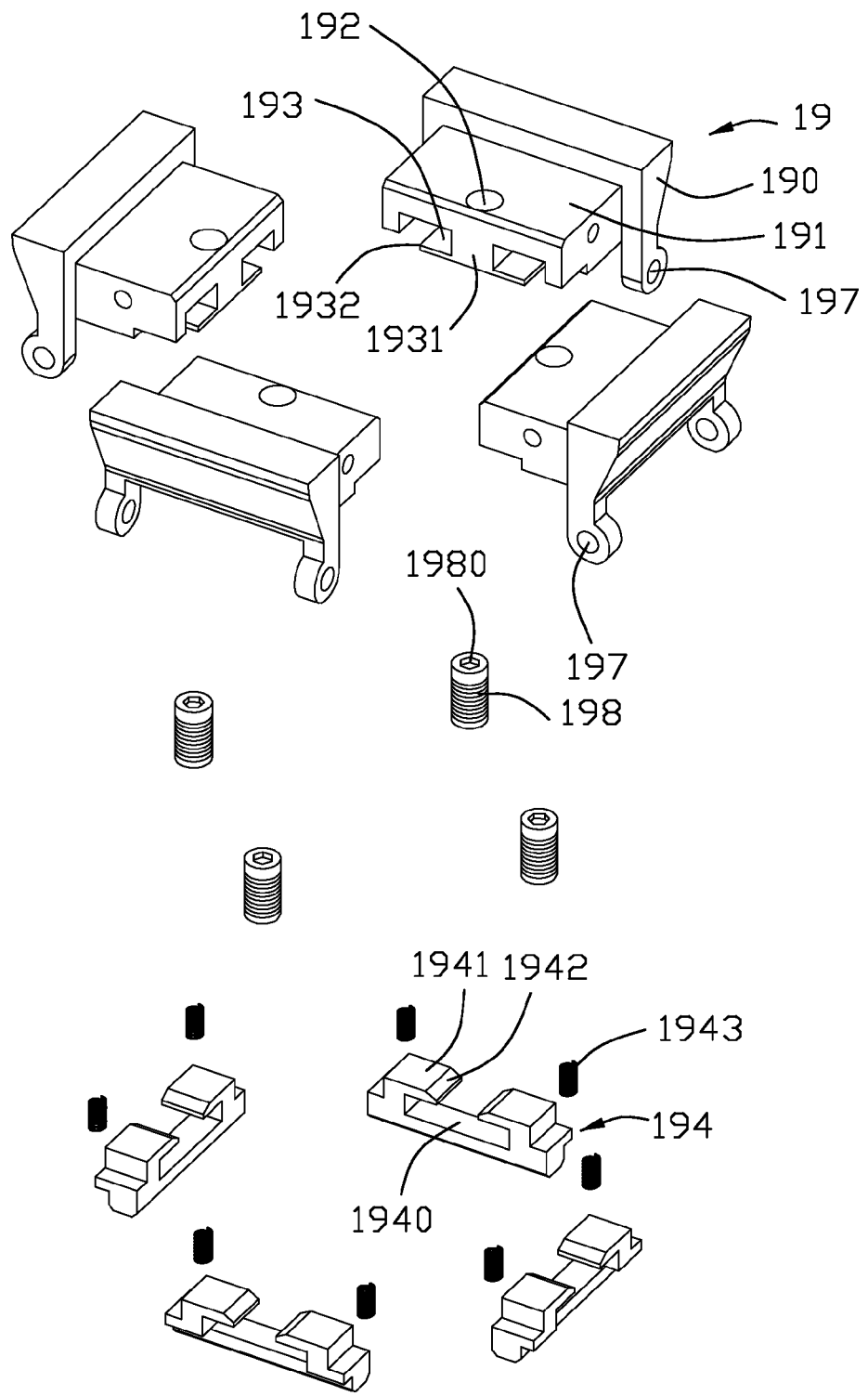
FIG. 3 is an exploded perspective view of a latch device of the IC socket shown in FIG. 1.

Particularly referring to FIGS. 2-3, the latch device 19 includes a latch body (not labeled), a pressing member 194 attached to the latch body, and a pair of spring members 1943 disposed between the latch body and the pressing member 194. The latch body further includes a rotating portion 190 and a carrying portion 191. The rotating portion 190 is configured with two shafts 6, 7 respectively located at two opposite ends thereof, wherein the shaft 6 is inserted into pivot holes 197 formed on the rotating portion 190 and connected with the linking portion 120 of the base 1. The other shaft 7 is inserted into a proper portion of the driving member 5. When the cover 5 is operated to move downward, the rotating portion 190 rotates backward and downward around the shaft 6. The carrying portion 191 extends perpendicularly from a center position of the rotating portion 190. The carrying portion 191 is formed with two cavities 193 and a middle wall 1931 between the two cavities 193. A stopping portion 1932 laterally extends from the bottom of the middle wall 1931 as to partially cover the cavities 193. A receiving hole 192 for receiving a regulator 198 is formed to extend through the middle wall 1931 in a vertical direction. The regulator 198 is configured with screw thread as to be able to rotate in the receiving hole 198 and is consequently movable in the vertical direction. The regulator 198 is employed to further limit the movement of the pressing member 194 and ensure sufficient loading force to be applied on the IC passage. The regulator 198 has an operating hole 1980 configured for an operating tool, such as a screw driver (not shown), to adjust the regulator 198.

The pressing member 194 includes a pressing portion 1940, a pair of hooks 1941 extending upward from the pressing portion 1940 and oriented toward each other. Each hook 1941 is configured with an indicating surface at a tip end thereof to engage scale marks (not shown) on the middle wall 193 1, so that the uppermost position of pressing member 194 is easy to be achieved by adjusting the regulator 198. The hooks 1941 are respectively mounted into the cavities 193 of the carrying portion 191 of the latch body which have bigger dimensions than the thicknesses of the hooks 1941, so that the pressing member 194 is movable within the latch body in the vertical direction. The stopping portion 1932 engages with the hooks 1941 to together constitute stopping means that prevents the pressing member 194 from escaping away from the latch device 19. The spring members 1943 are disposed at opposite shoulders of the pressing member 194.

Figure 4:
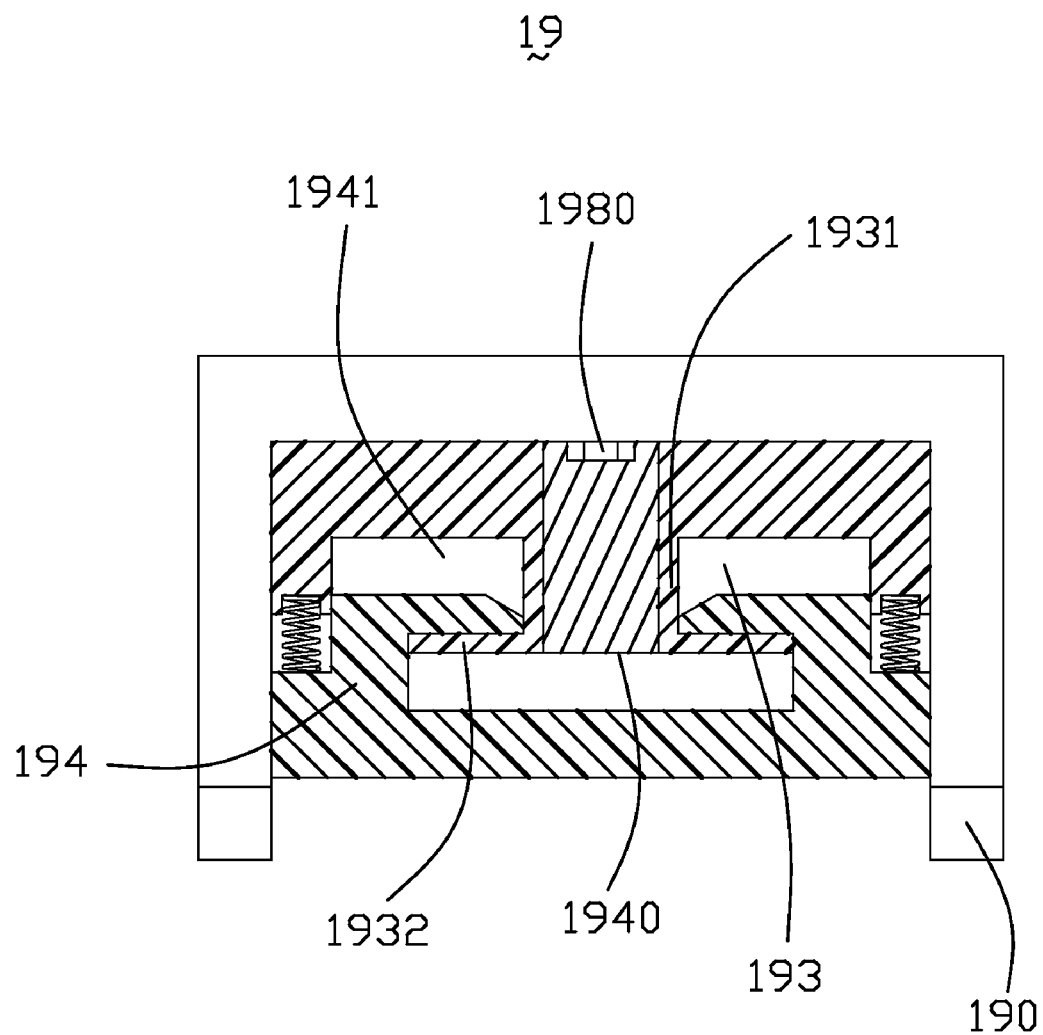
FIG. 4 is a cross-sectional view of the latch device disposed in an initial state.
Figure 5:
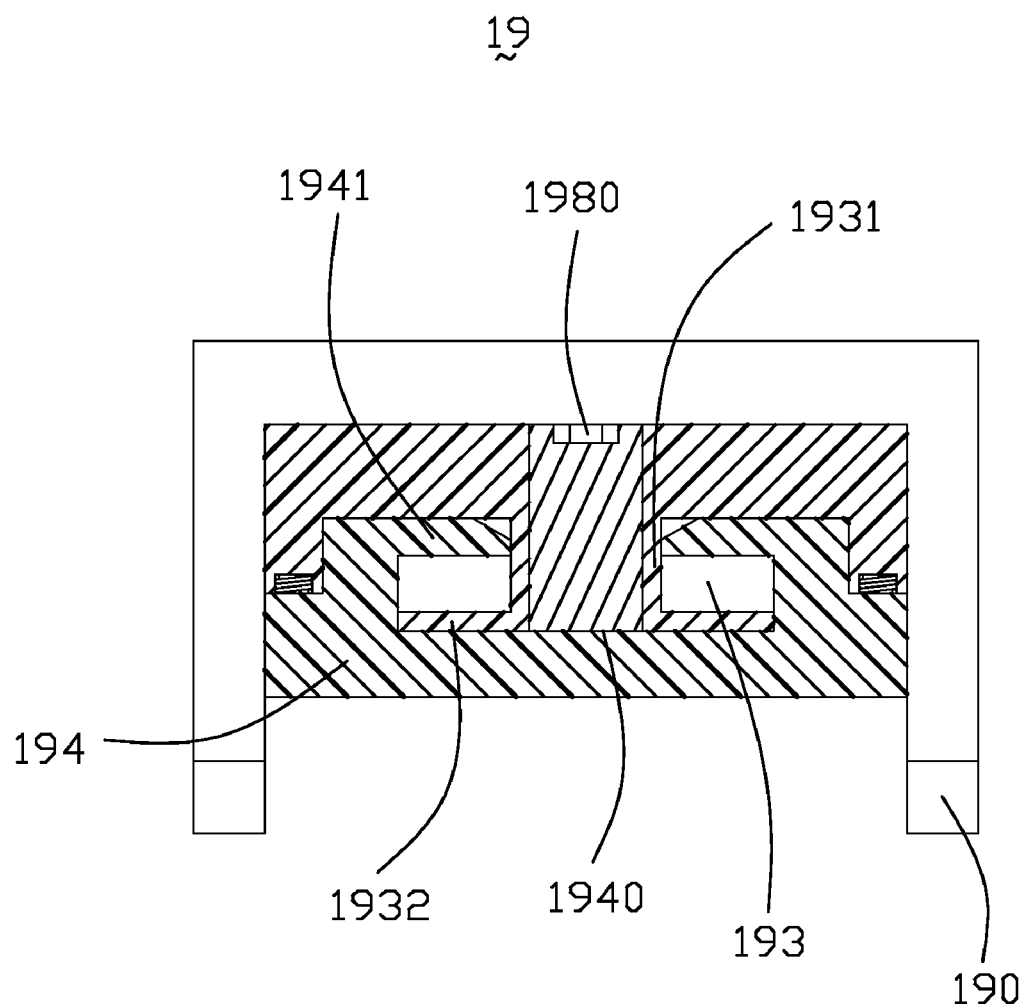
FIG. 5 is a cross-sectional view of the latch device disposed in a pressed state.

FIG. 4 is a cross-sectional view of the latch device 19, in which the pressing member 194 is in a released position (lowermost position), and FIG. 5 is a cross-sectional view illustrating the pressing member 194 in a pressed position (uppermost position). In the case that an IC package of thinner thickness is loaded into the socket body, downwardly adjust the regulator 198 and enable the regulator 198 to abut against the pressing portion 1940 when the pressing portion 1940 is pushed upward by the IC package while the spring member 198 is pressed simultaneously. Similarly, when an IC package having a thicker thickness is loaded, just upwardly adjust the regulator 198 to provide a large space for the movement of the pressing member 194.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An IC socket for receiving an IC package comprising:
a socket body for carrying the IC package;
a plurality of contacts received in the socket body for electrical connection with the IC package;
a driving member mounted upon the socket body, the driving member being able to operated between an upper position and a lower position; and
at least one latch device driven by the driving member to shift between a closed position and an opened position, the latch device having a movable pressing member engaging with a spring member and pressing the IC package toward the socket body, the position of pressing member being adjusted in a vertical direction by abutting against the IC package;
wherein the latch device comprises a latch body, the pressing member being movably mounted within the latch body.

2. The IC socket as claimed in claim 1, wherein the latch device has a regulator adjustable in the vertical direction to engage with the pressing member to limit the movement of the pressing member.

3. The IC socket as claimed in claim 2, wherein the latch body is formed with a cavity, and the pressing member has a hook mounted into the cavity so as to attach the pressing member to the latch body.

4. The IC socket as claimed in claim 3, wherein the latch body has a stopping portion, the hook engaging with the stopping portion to prevent the pressing member from escaping away form the latch device.

5. The IC socket as claimed in claim 4, wherein the hook of the pressing member is formed with an indicating surface for indicating the position of the pressing member relative to the latch body.

6. The IC socket as claimed in claim 5, wherein each pressing member is equipped with two said spring members respectively located at opposite shoulders thereof.

7. An IC socket for receiving an IC package comprising:
a socket body for carrying the IC package;
a plurality of contacts received in the socket body for electrical connection with the IC package;
a driving member mounted upon the socket body, the driving member being able to operated between an upper position and a lower position; and
at least one latch device comprising a latch body, a pressing member movably attached to the latch body, a spring member disposed therebetween to engage with the pressing member, and stopping means preventing the pressing member from escaping away from the latch body;
wherein the stopping means comprises a stopping portion formed on the latch body and a hook formed on the pressing member.

8. The IC socket as claimed in claim 7, wherein the latch device has a regulator capable of being adjusted a proper distance in a vertical direction in view of the thickness of the IC package loaded in the socket body.

9. The IC socket as claimed in claim 7, wherein each pressing member is equipped with two said spring members respectively located at opposite shoulders thereof.

10. The IC socket as claimed in claim 7, wherein the latch body is formed with a cavity, and the hook of the pressing member being mounted into the cavity so as to attach the pressing member to the latch body.

11. The IC socket as claimed in claim 10, wherein the hook of the pressing member is formed with an indicating surface for indicating the position of the pressing member relative to the latch body.

12. An IC socket assembly comprising:
a socket body defining a cavity receiving an IC package;
a plurality of contacts received in the socket body and electrical connection with the IC package;
a driving member mounted upon the socket body, the driving member being able to operated between an upper position and a lower position; and
at least one latch device driven by the driving member to pivotally shift between a closed position and an opened position, the latch device having a movable pressing member downwardly pressing the IC package toward the socket body, wherein
a most downward position of pressing member is adjustable so as to result in variable pressing positions in a vertical direction for coupling to other IC packages having different thicknesses with regard to the IC package.

13. The IC socket assembly as claimed in claim 12, wherein said pressing member is adjustably moveable along the vertical direction relative to the latch device.

14. The IC socket assembly as claimed in claim 13, wherein an adjustment between the pressing member and the latch device results from a screw.

15. The IC socket assembly as claimed in claim 14, further including a spring buffering between the pressing member and a carrying portion of the latch device in addition to said adjustment.

* * * * *